United States Patent [19]
Song

[11] Patent Number: 5,849,626
[45] Date of Patent: Dec. 15, 1998

[54] METHOD FOR FORMING ISOLATION REGION OF SEMICONDUCTOR DEVICE

[75] Inventor: Du Heon Song, Kyungki-do, Rep. of Korea

[73] Assignee: LG Semicon Co., Ltd., Cheongju-Si, Rep. of Korea

[21] Appl. No.: 871,947

[22] Filed: Jun. 10, 1997

[30] Foreign Application Priority Data

Jun. 10, 1996 [KR] Rep. of Korea ................... 1996 20652

[51] Int. Cl.⁶ .................................................. H01L 21/76
[52] U.S. Cl. ............................................................ 438/444
[58] Field of Search .................................. 438/444, 229, 438/230, 232

[56] References Cited

U.S. PATENT DOCUMENTS

| | | |
|---|---|---|
| 4,272,308 | 6/1981 | Varshney . |
| 4,965,221 | 10/1990 | Dennison et al. . |
| 5,173,444 | 12/1992 | Kawamura . |
| 5,612,247 | 3/1997 | Itabashi . |

OTHER PUBLICATIONS

Kaga, T. "Advanced OSELO Isolation . . . Submicrometer ULSI's", IEEE Transactions on electron Devices vol.35, No.7 pp. 893–898, Jul. 1988.

Jambotkar, C., "Method for Forming Recessed Oxide Isolation Islands", IBM Tech. Disc. Bull. vol.24, No.9, pp. 4744–4745, Feb. 1982.

*Primary Examiner*—George R. Fourson

[57] ABSTRACT

A method for forming an isolation region of a semiconductor device to improve isolation characteristics between semiconductor devices. A first insulating layer is formed on a substrate, and a second insulating layer is formed on the first insulating layer. A field region of the substrate is defined by selectively removing the second insulating layer. A portion of the surface of the substrate is then exposed by selectively removing the first insulating layer using the second insulating layer as a mask. A third insulating layer is formed on the exposed portion of the substrate. Then insulating sidewalls are formed on sides of the first and second insulating layers. Next, a trench is then formed in the substrate using the second insulating layer and the insulating sidewalls as masks. Finally, a field oxide layer is formed in the trench to isolate semiconductor devices.

8 Claims, 5 Drawing Sheets

METHOD FOR FORMING ISOLATION REGION OF SEMICONDUCTOR DEVICE

BACKGROUND OF THE INVENTION

1. Field of the Invention

The present invention relates to a method for forming an isolation region of a semiconductor device.

2. Discussion of the Related Art

With regard to a general metal oxide semiconductor ("MOS") device, isolation techniques for minimizing an isolation region (i.e., a field region that isolates semiconductor devices from one another) is one of the most important techniques for high integration of semiconductor devices.

There are three main methods for isolating semiconductor devices: the local oxidation of silicon (LOCOS) method, the shallow trench isolation (STI) method, and the selective epitaxial growth (SEG) method.

Among the three methods, the LOCOS method is commonly used because of its simplicity and excellent reproducibility. Moreover, such a method is expected to be used for future 1 Gbit DRAM devices.

A conventional method for forming an isolation region of a semiconductor device will be discussed with reference to the attached drawings.

Referring to FIGS. 1a through 1f, there is illustrated a conventional method for forming an isolation region of a semiconductor device.

As shown, in FIG. 1a, on a silicon substrate 11, a pad oxide layer 12 and a nitride layer 13 are sequentially formed.

Subsequently, a photoresist layer 14 is coated on the nitride layer 13, which is patterned, as shown in FIG. 1b. With the patterned photoresist layer 14 serving as a mask, the nitride layer 13 and the pad oxide layer 12 are selectively removed to form a nitride pattern 13a and a pad oxide pattern 12a; thereby defining a field region 18.

Next, as shown in FIG. 1c, the remaining photoresist layer 14 is removed. An insulating layer (not shown) is then formed on the entire surface inclusive of the nitride pattern 13a using a chemical vapor deposition (CVD) method, and etched back to form insulating sidewalls 15 on the sides of the nitride and pad oxide patterns 13a and 12a.

As shown in FIG. 1d, with the nitride pattern 13a and the insulating sidewalls 15 serving as masks, the silicon substrate 11 is anisotropically etched to form a trench 19 having a predetermined depth.

As shown in FIG. 1e, with the nitride pattern 13a and the insulating sidewalls 15 serving as masks, channel stop ions are implanted into the substrate, and then an annealing process is performed to form a field oxide layer 16.

As shown in FIG. 1f, the remaining nitride pattern 13a, the remaining pad oxide pattern 12a, and the insulating sidewalls 15 are removed so that the field oxide layer 16, formed in the silicon substrate 11, isolates semiconductor devices.

However, problems exist with the conventional method for forming an isolation region. First, since the thickness of the pad oxide layer 12 is thin, it is very difficult to prevent the silicon substrate under the pad oxide layer 12 from being etched when the pad oxide layer 12 and the nitride layer 13 thereon are etched to expose the surface of the silicon substrate 11.

SUMMARY OF THE INVENTION

The present invention is directed to a method for forming an isolation region of a semiconductor device that substantially obviates one or more problems due to limitations and disadvantages of the related art.

An object of the present invention is to provide a method for forming a uniform isolation region to improve isolation characteristics of semiconductor devices.

To achieve these and other objects in accordance with the purpose of the present invention, as embodied and broadly described, there is provided a method for forming an isolation region of a semiconductor device that includes the steps of forming a first insulating layer on a substrate; forming a second insulating layer on the first insulating layer; selectively removing the second insulating layer over a field region of the substrate; selectively removing the first insulating layer to expose a portion of the substrate using the second insulating layer as a mask; forming a third insulating layer on the exposed portion of the substrate; forming insulting sidewalls on sides of the first and second insulating layers; forming a trench in the substrate using the second insulating layer and the insulating sidewalls as a mask; and forming a field oxide layer in the trench.

To achieve these and other objects in accordance with the purpose of the present invention, as embodied and broadly described, there is provided another method for forming an isolation region on a semiconductor substrate that includes the steps of forming a first insulating layer on a substrate; forming a second insulating layer on the first insulating layer; selectively removing the second insulating layer over a field region of the substrate; selectively removing the first insulating layer to expose a portion of the substrate using the second insulating layer as a mask; forming a third insulating layer using the second insulating layer as a mask; forming insulating sidewalls at sides of the second, first, and third insulating layer; forming a trench in the substrate using the second insulating layer and the insulating sidewalls as a mask; forming a field oxide layer in the trench.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow, and the accompanying drawings which are given by way of illustration only, and thus are not limitative of the present invention, and wherein.

DETAILED DESCRIPTION OF THE PREFERRED EMBODIMENTS

A method for forming an isolation region of a semiconductor device according to the present invention will now be described with reference to the accompanying drawings.

Referring to FIGS. 2a through 2g, there is illustrated a method for forming an isolation region of a semiconductor device according to a preferred embodiment of the present invention.

Figure 1A:
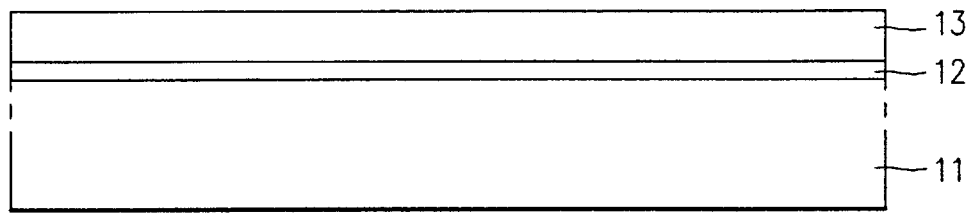
FIGS. 1a through 1f are cross-sectional views showing a conventional art method for forming an isolation region of a semiconductor device.
Figure 1B:
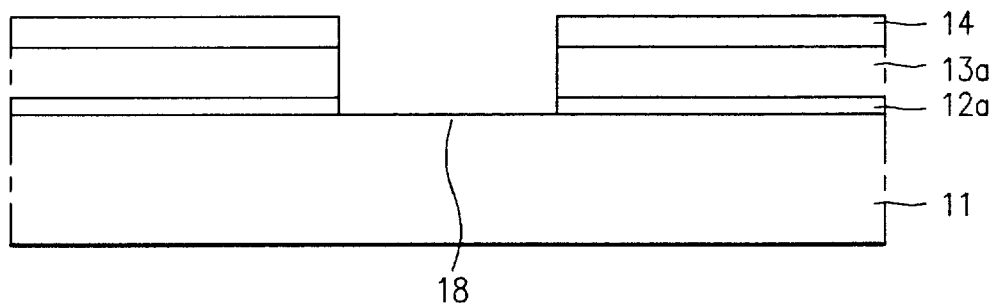
Figure 1C:
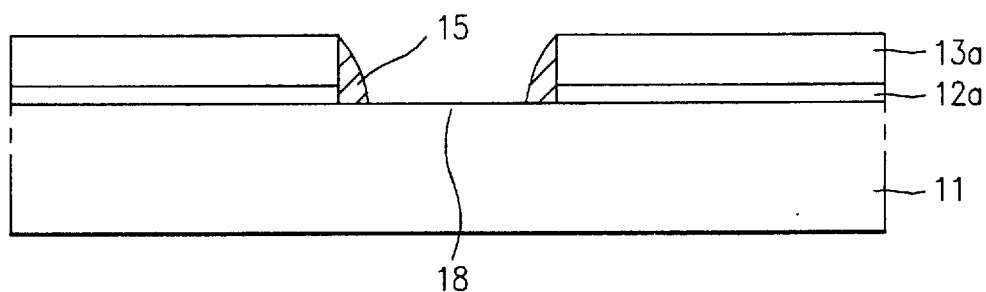
Figure 1D:
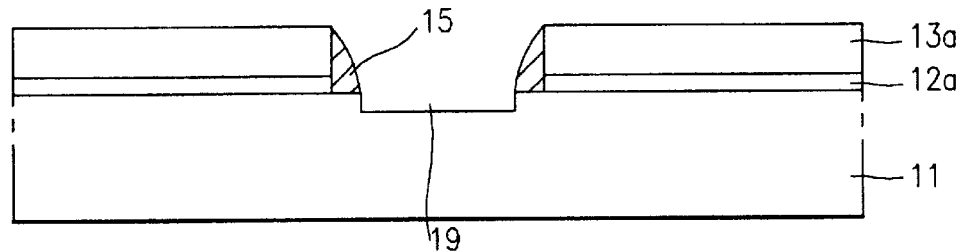
Figure 1E:
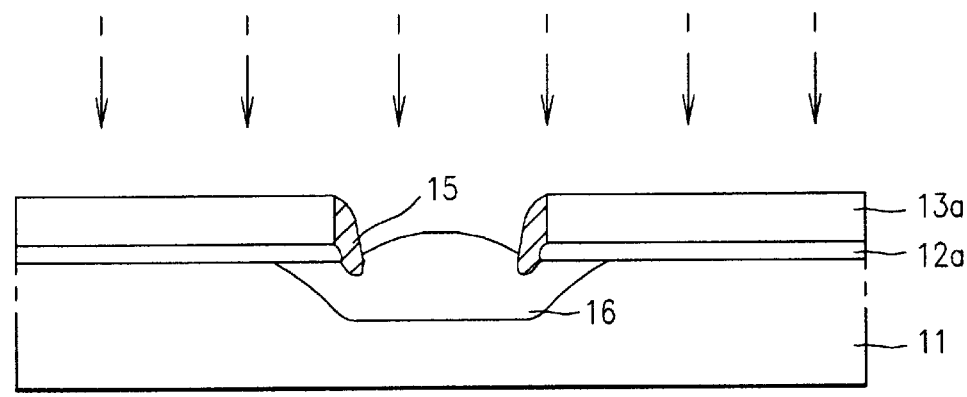
Figure 1F:
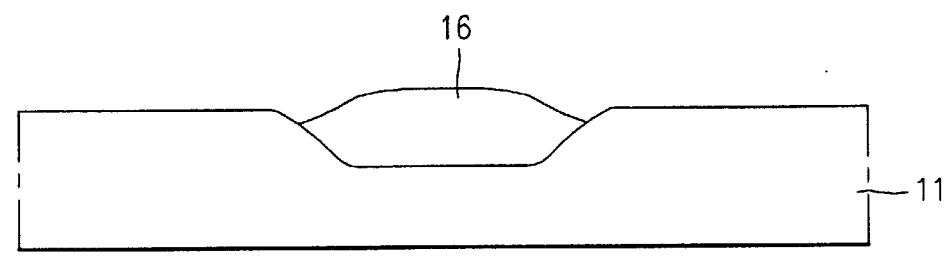
Figure 2A:
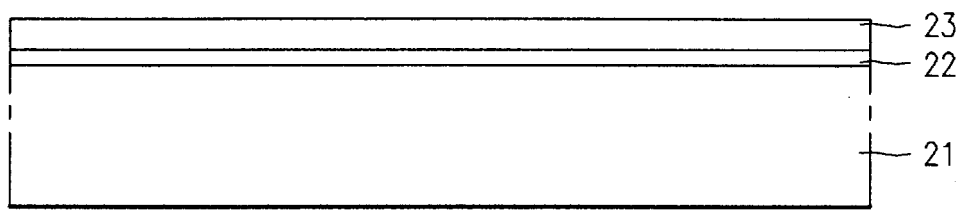
FIGS. 2a through 2g are cross-sectional views showing a method for forming an isolation region of a semiconductor device according to a preferred embodiment of the present invention.

Referring initially to FIG. 2a, a 100–1000 Angstrom thick pad oxide layer 22 is formed on a silicon substrate 21. A 1000–2500 Angstrom thick nitride layer 23 is then formed on the pad oxide layer 22. The pad oxide layer 22 is used as a stress-relief oxide layer, which serves as a cushion between the silicon substrate 21 and the nitride layer 23 during, e.g., a LOCOS method process.

Figure 2B:
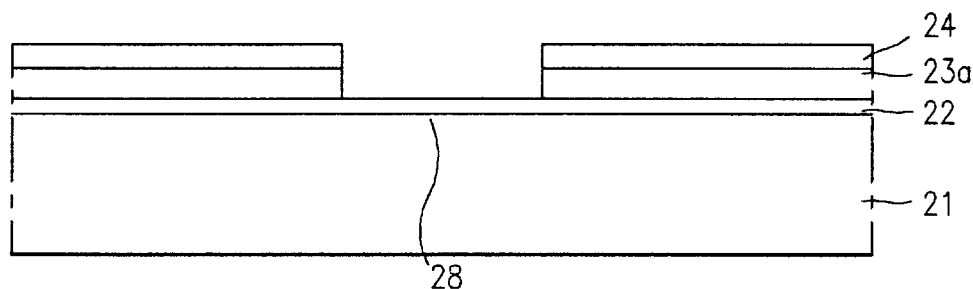

Subsequently, as shown in FIG. 2b, a photoresist layer 24 is coated on the nitride layer 23 and then it patterned through exposure and development. Next, with the patterned photoresist 24 serving as a mask, the nitride layer 23 is selectively removed to form a nitride layer pattern 23a. As a result, an area for a field region 28 is defined.

Figure 2C:
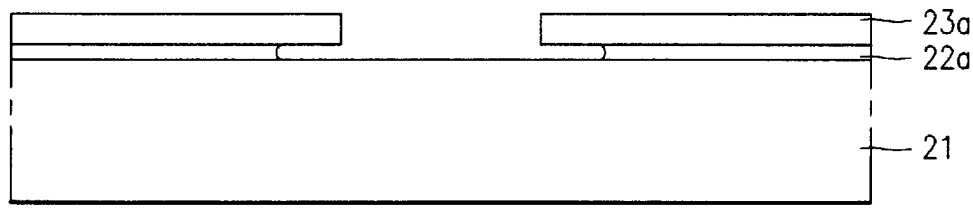

Referring to FIG. 2c, the remaining photoresist layer 24 is removed. With the nitride layer pattern 23a serving as a mask, the pad oxide layer 22 is selectively wet-etched until the surface of the silicon substrate 21 is exposed. The wet-etch process also undercuts the pad oxide layer 22 by laterally over-etching the pad oxide layer 22 along the substrate 21 by 100–1000 Angstroms; thereby forming a pad oxide layer pattern 22a.

Figure 2D:
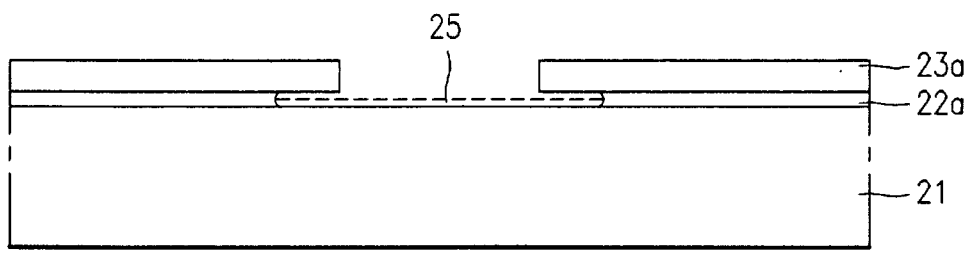

Referring to FIG. 2d, an oxide layer 25 is formed on the exposed surface of the substrate 21. In this case, the thickness of the oxide layer 25 is thinner than the pad oxide layer 22a.

Figure 2E:
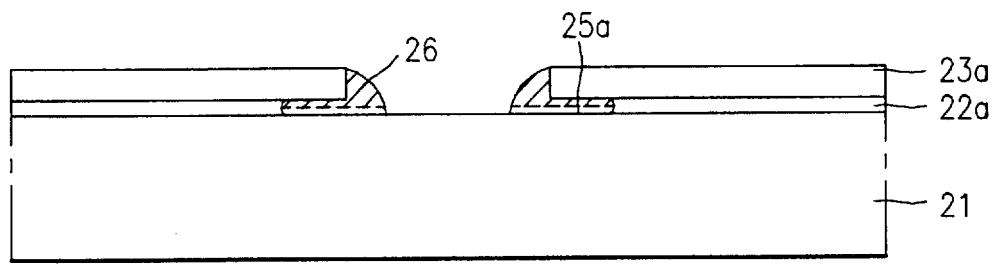

Referring to FIG. 2e, with the nitride pattern 23a serving as a mask, the oxide layer 25 is selectively dry-etched until the surface of the substrate is exposed thereby forming an oxide layer pattern 25a. Then an insulating layer (not shown) is formed over the substrate 21 and an etched back to form insulating sidewalls 26 on the sides of the nitride layer pattern 23a, the pad oxide layer pattern 22a, and on a portion of the oxide layer pattern 25a. The insulating sidewalls 26 have a thickness of 100–700 Angstroms and a distance between each nitride layer pattern 23a is 0.25 um, which is the same as the width of an isolation region to be formed.

Figure 2F:
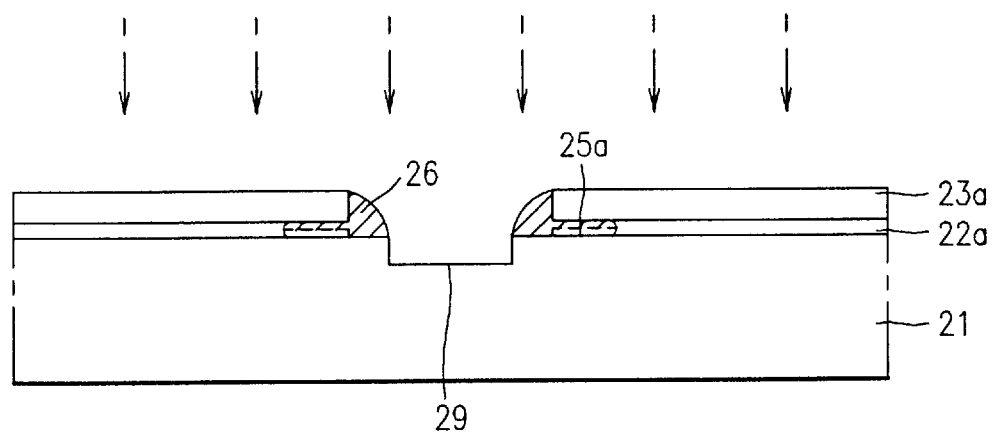

Referring to FIG. 2f, with the nitride pattern 23a and the insulating sidewalls 26 serving as masks, a trench 29 of a predetermined depth is formed in the substrate 21. In this case, the depth of the trench is not more than 1000 Angstroms. Alternatively, referring to FIG. 2e, the etching of the oxide layer 25 may be omitted, i.e., after forming the oxide layer 25 and the insulating sidewalls 26, with the nitride layer pattern 23a and the insulating sidewalls 26 serving as a mask, the exposed portion of the oxide layer 25 and the substrate 21 is etched to form the trench at the same time.

Figure 2G:
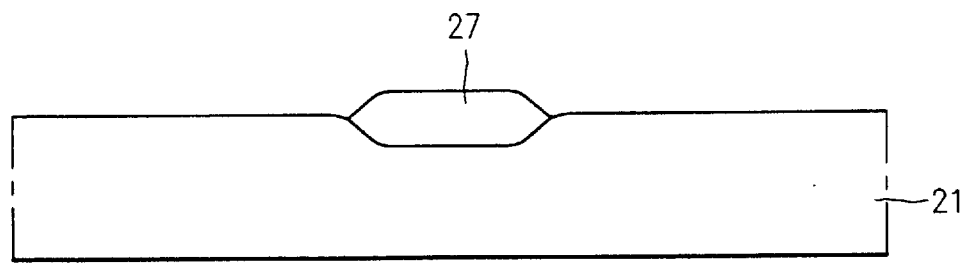

Referring to FIG. 2g, with the nitride pattern 23a and the insulating sidewalls 26 still serving as masks, channel ion implantation is carried out, and then an annealing process is carried out to form a field oxide layer 27 in the trench 29. Thereafter, the nitride layer pattern 23a, the insulating sidewalls 26, the oxide layer pattern 25a, and the pad oxide layer pattern 22a are removed; thereby completing the isolation region of a semiconductor device. The field oxide layer 27 is 3000–5000 Angstrom thick and the temperature during the annealing process is 1000°–1200° C.

Figure 3:
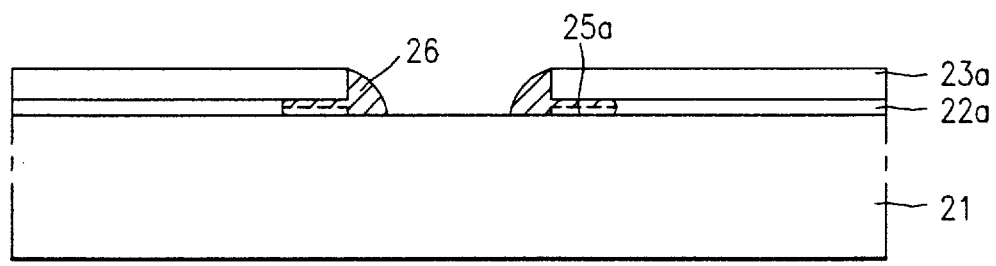
FIG. 3 is a cross-sectional view showing a method step according to another embodiment of the present invention.

In another embodiment, the process step as illustrated in FIG. 2e of the previous embodiment may be substituted with the process step as illustrated in FIG. 3. As shown in FIG. 3, with the nitride layer pattern 23a serving as a mask, the surface of the substrate 21 is exposed by dry-etching the oxide layer 25 to form oxide layer pattern 25a. Thereafter, an insulating layer (not shown) is formed over the substrate 21 and etched back to form insulating side walls 26 on the sides of the nitride layer pattern 23a, the pad oxide layer pattern 22a, and the oxide layer pattern 25a.

The method for forming an isolation region of a semiconductor device has the following advantages.

First, since the pad oxide layer 22 is thick, damage to the substrate 21 when forming a nitride layer pattern 23a is prevented.

Second, by using a non-uniform pad oxide layer, bird's beak is reduced and stress on a nitride layer is relieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming an isolation region of a semiconductor device, comprising the steps of:

forming a first insulating layer on a substrate;

forming a second insulating layer on the first insulating layer;

selectively removing the second insulating layer over a field region of the substrate;

selectively removing the first insulating layer to expose a portion of the substrate using the second insulating layer as a mask;

forming a third insulating layer on the exposed portion of the substrate;

removing a portion of the third insulating layer using the second insulating layer as a mask such that the third insulating layer is only disposed under the second insulating layer;

forming insulating sidewalls at sides of the second, first, and third insulating layers;

forming a trench in the substrate using the second insulating layer and the insulating sidewalls as a mask;

forming a field oxide layer in the trench.

2. The method as claimed in claim 1, wherein the forming the third insulating layer step forms the third insulating layer thinner than the first insulating layer.

3. The method as claimed in claim 1, wherein the first insulating layer is a pad oxide layer.

4. The method as claimed in claim 3, wherein the forming the first insulating layer step forms a 100–1000 Angstrom thick pad oxide layer.

5. The method as claimed in claim 1, wherein the selectively removing the first insulating layer step includes the step of:

wet-etching the first insulating layer.

6. The method as claimed in claim 5, wherein the wet-etching the first insulating layer step over-etches the first insulating layer such that a portion of the first insulating layer between the substrate and the second insulating layer is removed.

7. The method as claimed in claim 1, wherein the selectively removing the first insulating layer step removes a portion of the first insulating layer such that a portion of the first insulating layer between the substrate and the second insulating layer is removed.

8. The method as claimed in claim 1, further comprising, prior to said forming the field oxide layer step, the step of:

implanting channel ions into the substrate, and wherein the forming the field oxide layer step includes the step of annealing the substrate with the implanted channel ions thereby forming the field oxide layer.

* * * * *